US011587856B2

(12) United States Patent
Antonello et al.

(10) Patent No.: US 11,587,856 B2
(45) Date of Patent: Feb. 21, 2023

(54) SOLID STATE SWITCHING DEVICE

(71) Applicant: ABB Schweiz AG, Baden (CH)

(72) Inventors: Paolo Antonello, Aluno (IT); Luca Ghezzi, Gallarate (IT); Yu Du, Raleigh, NC (US); Taosha Jiang, Cary, NC (US); Rostan Rodrigues, Raleigh, NC (US)

(73) Assignee: ABB Schweiz AG, Baden (CH)

( * ) Notice: Subject to any disclaimer, the term of this patent is extended or adjusted under 35 U.S.C. 154(b) by 483 days.

(21) Appl. No.: 16/494,569

(22) PCT Filed: Mar. 8, 2018

(86) PCT No.: PCT/EP2018/055722
§ 371 (c)(1),
(2) Date: Sep. 16, 2019

(87) PCT Pub. No.: WO2018/166878
PCT Pub. Date: Sep. 20, 2018

(65) Prior Publication Data

US 2021/0118777 A1 Apr. 22, 2021

Related U.S. Application Data

(63) Continuation of application No. 15/460,033, filed on Mar. 15, 2017, now abandoned.

(51) Int. Cl.
*H01L 23/495* (2006.01)
*H01L 23/367* (2006.01)
*H01L 23/373* (2006.01)

(52) U.S. Cl.
CPC ...... *H01L 23/49568* (2013.01); *H01L 23/367* (2013.01); *H01L 23/3736* (2013.01);
(Continued)

(58) Field of Classification Search
CPC ............. H01L 23/49568; H01L 23/367; H01L 23/3736; H01L 23/4951; H01L 23/49531; H01L 23/49582
See application file for complete search history.

(56) References Cited

U.S. PATENT DOCUMENTS 6,787,900 B2 * 9/2004 Shinohara ............... H01L 23/13
257/711
8,897,015 B2 * 11/2014 Feller ...................... H01L 23/13
361/717

(Continued)

FOREIGN PATENT DOCUMENTS

WO 2016132372 A1 8/2016

OTHER PUBLICATIONS

European Patent Office, International Search Report & Written Opinion issued in corresponding Application No. PCT/EP2018/055722, dated May 22, 2018, 9 pp.

*Primary Examiner* — Eugene Lee
(74) *Attorney, Agent, or Firm* — Armstrong Teasdale LLP

(57) ABSTRACT

Solid state switching device including: a pair of line terminals including first and second line terminals for electrical connection with a corresponding phase conductor of an electric line; a switching assembly including one or more solid state power switches, the switching assembly having a first and second power terminals electrically connected with the first and second lines terminals, respectively; a heat sink element in thermal coupling with the switching assembly to adsorb heat from the switching assembly; an additional heat extraction arrangement to extract heat from the switching assembly and convey at least a portion of the adsorbed heat along the phase conductor through the first and second line terminals.

18 Claims, 14 Drawing Sheets

(52) U.S. Cl.
CPC .... *H01L 23/4951* (2013.01); *H01L 23/49531* (2013.01); *H01L 23/49582* (2013.01)

(56) References Cited

U.S. PATENT DOCUMENTS

| | | | |
|---|---|---|---|
| 8,981,552 B2* | 3/2015 | Shimoike | H01L 24/29 257/693 |
| 9,812,446 B2* | 11/2017 | Shin | H01L 27/0711 |
| 10,700,043 B1* | 6/2020 | Sullivan | H01L 23/36 |
| 2005/0161785 A1 | 7/2005 | Kawashima et al. | |
| 2009/0261472 A1* | 10/2009 | Bayerer | H01L 24/06 257/E23.101 |
| 2010/0127371 A1* | 5/2010 | Tschirbs | H05K 1/142 257/E23.083 |
| 2014/0001488 A1* | 1/2014 | Perkins | H01L 25/072 257/77 |
| 2014/0118956 A1* | 5/2014 | Kim | H01L 24/40 361/728 |
| 2016/0181175 A1* | 6/2016 | Ikeda | H01L 21/4817 438/109 |
| 2021/0043605 A1* | 2/2021 | Mueller | H01L 25/0655 |
| 2021/0175181 A1* | 6/2021 | Kim | H01L 24/80 |

* cited by examiner

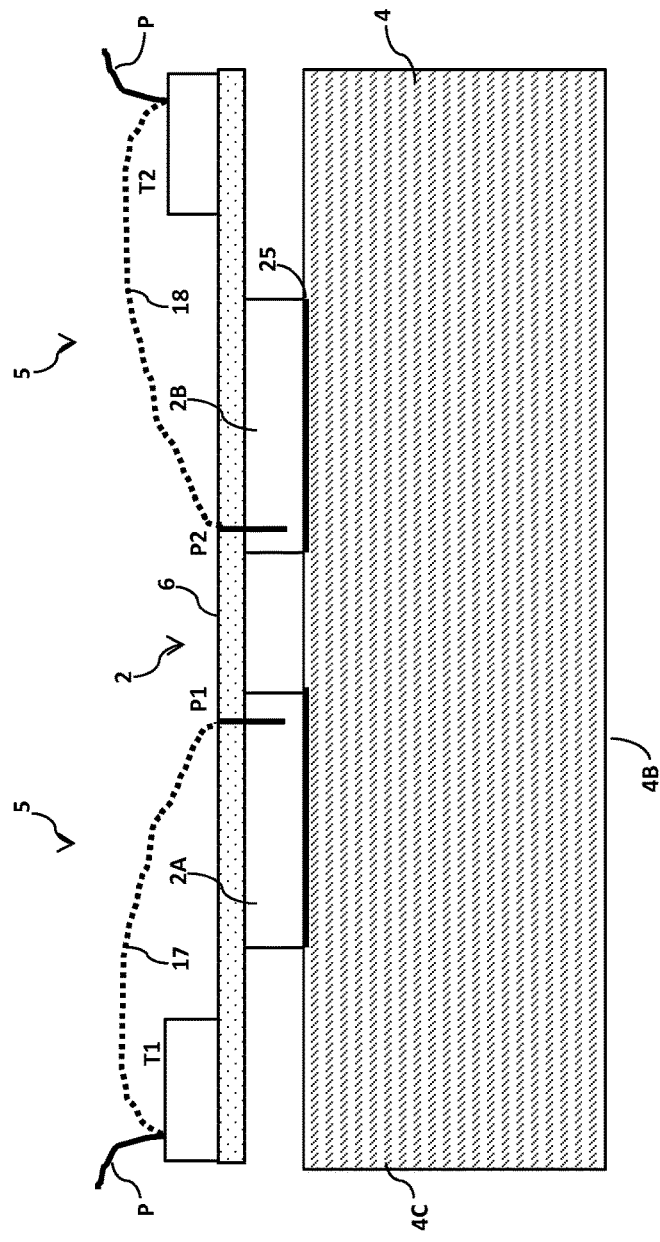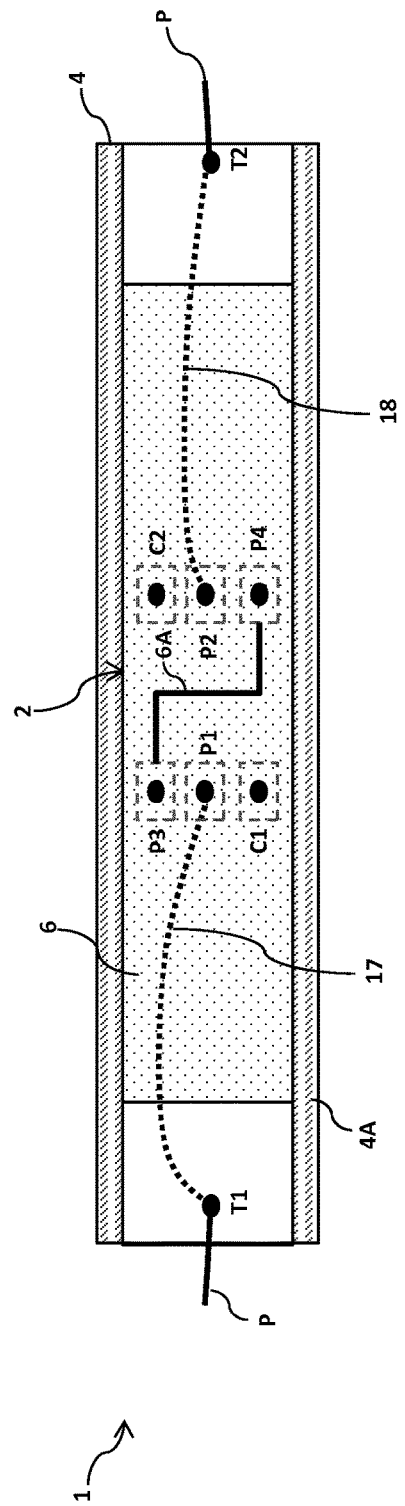
FIG. 9

SOLID STATE SWITCHING DEVICE

TECHNICAL FIELD

The present invention relates to a solid state switching device, such as a solid state circuit breaker, residual current device, disconnector, relay, contactor or the like for low voltage applications, i.e. for applications referring to operating voltages lower than 1 kV AC and 1.5 kV DC.

BACKGROUND INFORMATION

Solid state switching devices are widely used in low voltage switchboards or electric power distribution grids to switch a line current flowing along an electric line.

As is known, solid state switching devices comprise one or more solid state power switches (e.g. MOSFETs) capable of switching in a controlled manner between an interdiction state, in which the passage of a current between a pair of power terminals is blocked, and a conduction state, in which the passage of a current between said power terminals is allowed.

In operation, solid state power switches produce a significant amount of heat as they have to switch relatively high currents, e.g. in the range of 10-20 A.

As is known, in a solid state switching device, it is common practice to arrange a heat sink element (generally made of Al) in thermal coupling with the power switches to adsorb heat generated during operation and dissipate the adsorbed heat in the external environment through air convention. In this way, the temperature of the power switches may be kept under control, thereby avoiding malfunctioning or faults due to an excessive operating temperature.

In traditional switching devices, heat sink elements having a large size are generally used to ensure a sufficient heat dissipation.

Unfortunately, the employment of these cumbersome components entail an overall increase of the overall size.

This drawback entails serious difficulties in realizing solid state switching devices having size and form factor similar to those of electro-mechanical switching devices. As a result, solid state switching devices may be difficult to install when small installation spaces are available. Other solutions of the state of the art, in the attempt of reducing the size of the heat sink element, provide for employing heat sink elements realized in materials ensuring high levels of heat dissipation efficiency.

These solutions are however quite expensive and may entail a remarkable increase of the industrial costs of the switching devices.

BRIEF SUMMARY OF THE INVENTION

Hence, there is desire to provide a solid state switching device for low voltage applications, which is capable of overcoming or mitigating the drawbacks described above and in particular in which an efficient heat extraction from the solid state power switches is realized to keep the operating temperature of said power switches under control.

A further desire is to provide a solid state switching device having a relatively small size with respect to the currently available devices of the same type.

Yet a further desire is to provide a solid state switching device easy to produce at industrial level, at competitive costs with respect to currently available devices of the same type.

These desires, are achieved by a solid state switching device according to the claims proposed hereafter.

In a general definition, the switching device, according to the invention, comprises:
- a pair of line terminals including first and second line terminals for electrical connection with a corresponding phase conductor of said electric line;
- a switching assembly including one or more solid state power switches, said switching assembly having a first and second power terminals electrically connected with said first and second line terminals, respectively;
- a heat sink element in thermal coupling with said switching assembly to adsorb heat from said switching assembly;
- an additional heat extraction arrangement to extract heat from said switching assembly and convey at least a portion of the adsorbed heat along said phase conductor through said first and second line terminals.

BRIEF DESCRIPTION OF THE DRAWINGS

Further characteristics and advantages of the present invention will be more apparent with reference to the description given below and to the accompanying figures, provided purely for explanatory and non-limiting purposes, wherein:

FIGS. 9-10 schematically illustrate a further embodiment of the solid state switching device, according to the invention;

DETAILED DESCRIPTION OF THE INVENTION

Figure 1:
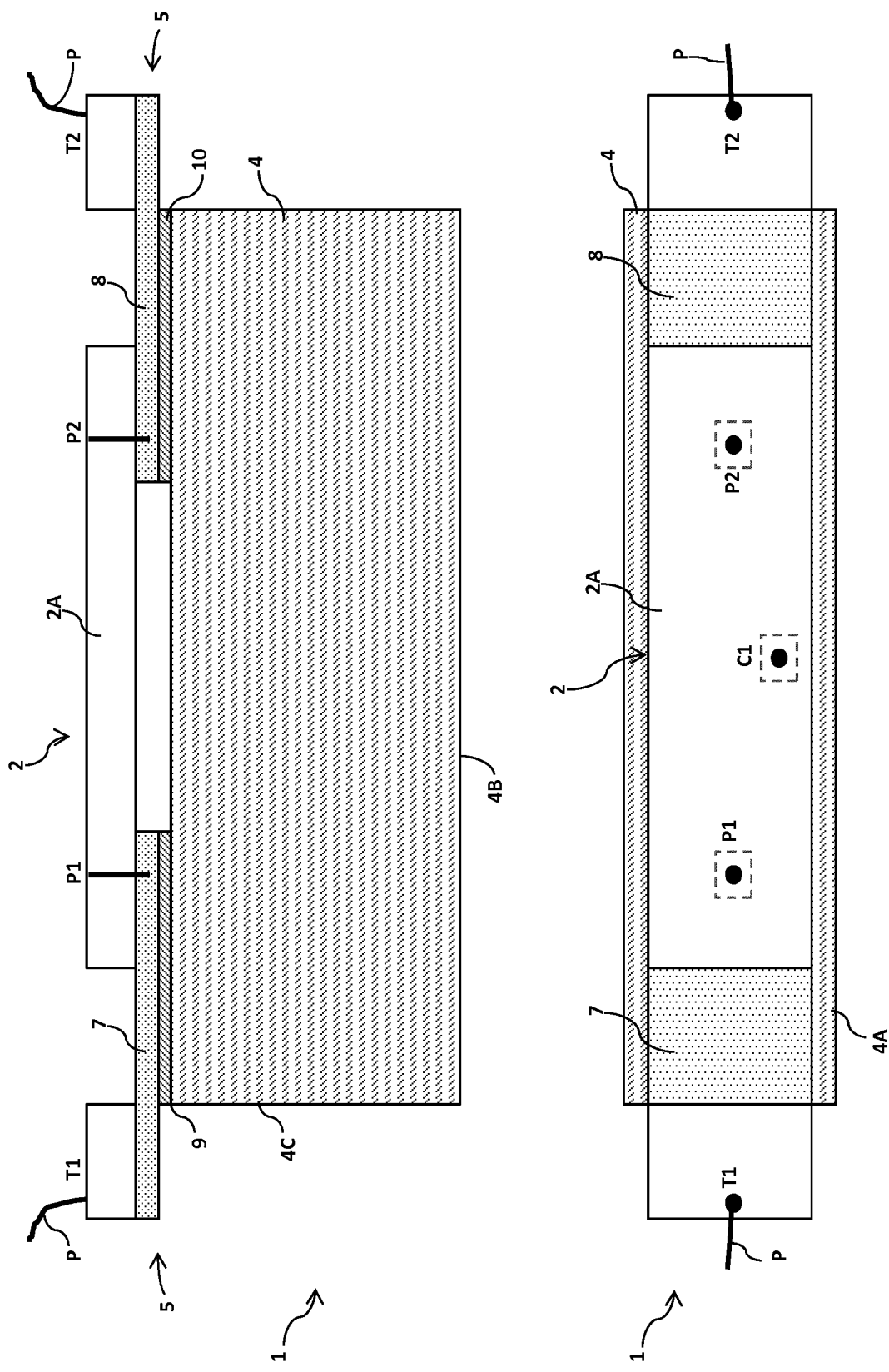
FIGS. 1-2 schematically illustrate an embodiment of the solid state switching device, according to the invention.

In the following detailed description, identical or similar elements or components, either from a structural and/or functional point of view, can have the same reference numerals, regardless of whether they are shown in different embodiments of the invention.

With reference to the aforesaid figures, the present invention relates to a solid state switching device 1 for low voltage applications.

The switching device 1 may be a solid state circuit breaker, residual current device, disconnector, relay, contactor or the like.

In general, the switching device 1 is adapted to switch in a controlled manner between an open state and a closing state to switch a line current flowing through at least a phase conductor P of an electric line of a low voltage electric power distribution grid.

Said electric line may comprise a single phase conductor (single-phase electric line) or multiple phase conductors (multi-phase electric line) and, in some applications (e.g. in 1P+N residual current devices), it may comprise also a neutral conductor N.

The switching device 1 comprises at least a pair of line terminals, which includes first and second line terminals T1, T2 for electrical connection with a corresponding phase conductor P of said electric line.

The line terminals T1, T2 are electrically coupleable to different portions of the phase conductor P, e.g. to a portion feeding an electric load and to a portion receiving electric power from an electric power source, respectively.

Conveniently, in the embodiments of the invention in which the above-mentioned electric line comprises a neutral conductor N, the switching device 1 comprises first and second neutral terminals N1, N2 for electrical connection with said neutral conductor N.

The neutral terminals N1, N2 are conveniently electrically coupleable to different portions of the neutral conductor N and are electrically connected one to another by means of a conductive element 15 (e.g. a cable, a conductive bridge or a conductive trace deposited on a PCB) in order to ensure the electric continuity of the neutral conductor N.

Conveniently, the terminals T1, T2, N1, N2 are formed by corresponding cable connectors made, at least partially, of a thermally and electrically conductive material, e.g. a metal material such as steel or copper.

In general, the terminals T1, T2, N1, N2 may be of known type and they will not be further described hereinafter for the sake of brevity.

According to the invention, the switching device 1 comprises at least a switching assembly 2 including one or more solid state power switches 2A, 2B.

The power switches 2A, 2B are adapted to switch in a controlled manner between an interdiction state, in which the passage of a current between their power terminals is blocked, and a conduction state, in which the passage of a current between their power terminals is allowed.

The power switches 2A, 2B may be semiconductor switches of known type, e.g. BJTs, FETs, MOSFETs, HEMTs, IGBTs, thyristors or other similar semiconductor devices, e.g. made of silicon semiconductor materials and wide bandgap (WBG) semiconductor materials, such as silicon carbide (SiC) and gallium nitride (GaN).

In general, the power switches 2A, 2B may be of known type and they will not further described hereinafter for the sake of brevity.

According to the embodiments of the invention shown in FIGS. 1-6, the switching assembly 2 comprises a single solid state power switch 2A.

According to the embodiments of the invention shown in FIGS. 7-12, the switching assembly 2 comprises two solid state power switches 2A, 2B electrically connected one to another.

According to the invention, the switching assembly 2 comprises first and second power terminals P1, P2 that are electrically connected to the first and second line terminals T1, T2 of the switching device 1.

According to the embodiments of the invention shown in FIGS. 1-6, the first and second power terminals P1, P2 are formed by or electrically connected with corresponding power terminals of the single power switch 2A.

As an example, if the single power switch 2A is a FET or a MOSFET, the first and second power terminals P1, P2 are formed respectively by the drain and source terminals of such a transistor or are electrically connected with said drain and source terminals.

As an example, if the single power switch 2A is a BJT, the first and second power terminals P1, P2 are formed respectively by the collector and emitter terminals of such a transistor or are electrically connected with said collector and emitter terminals.

According to the embodiments of the invention shown in FIGS. 7-12, the first and second power terminals P1, P2 are formed by or electrically connected with corresponding power terminals of the power switches 2A, 2B.

As an example, if the power switches 2A, 2B are FETs or MOSFETs, the first and second power terminals P1, P2 are formed respectively by the drain terminals of such transistors or are electrically connected with said drain terminals.

As an example, if the power switches 2A, 2B are a BJTs, the first and second power terminals P1, P2 are formed respectively by the collector terminals of such transistors or are electrically connected with said collector terminals.

According to the embodiments of the invention shown in FIGS. 7-12, the switching assembly 2 comprises third and fourth power terminals P3, P4 electrically connected one to another to ensure electrical continuity between the power switches 2A, 2B.

The third and fourth power terminals P3, P4 are formed by or electrically connected with corresponding power terminals of the power switches 2A, 2B.

As an example, if the power switches 2A, 2B are FETs or MOSFETs, the third and fourth power terminals P3, P4 are formed respectively by the source terminals of such transistors or are electrically connected with said source terminals.

As an example, if the power switches 2A, 2B are a BJTs, the third and fourth power terminals P3, P4 are formed respectively by the emitter terminals of such transistors or are electrically connected with said emitter terminals.

According to the embodiments of the invention shown in FIGS. 1-6, the switching assembly 2 comprises a control terminal C1 configured to receive a control signal (e.g. a logic signal) to control the operative status of the single power switch 2A.

The control terminal C1 is formed by or electrically connected with a corresponding control terminal of the single power switch 2A.

As an example, if the single power switch 2A is a FET or a MOSFET, the control terminal C1 is formed by the gate terminal of such a transistor or is electrically connected with said gate terminal.

As an example, if the single power switch 2A is a BJT, the control terminal C1 is formed by the base terminal of such a transistor or is electrically connected with said base terminal.

According to the embodiments of the invention shown in FIGS. 7-12, the switching assembly 2 comprises first and second control terminals C1, C2 configured to receive control signals (e.g. logic signals) to control the operative status of the power switches 2A, 2B.

The control terminals C1, C2 are formed by or electrically connected with corresponding control terminals of the power switches 2A, 2B.

As an example, if the power switches 2A, 2B are FETs or MOSFETs, the first and second control terminals C1, C2 are formed respectively by the gate terminals of such transistors or are electrically connected with said gate terminals.

As an example, if the power switches 2A, 2B are a BJTs, the first and second control terminals C1, C2 are formed respectively by the base terminals of such transistors or are electrically connected with said base terminals.

In view of the above, it is evident that:

when the one or more power switches 2A, 2B switch in an interdiction state (following the receipt of suitable control signals at the respective one or more control terminals C1, C2), a line current, which passes through the power terminals P1, P2 (and therefore through the line terminals T1, T2 and the phase conductor P), is interrupted;

when the one or more power switches 2A, 2B switch in a conduction state (following the receipt of suitable control signals at the respective one or more control terminals C1, C2), the passage of a line current through the power terminals P1, P2 (and therefore through the line terminals T1, T2 and the phase conductor P), is allowed.

According to the invention, the switching device 1 comprises at least a heat sink element 4 in thermal coupling with the switching assembly 2 to adsorb heat from this latter.

More particularly, the heat sink element 4 is thermally coupled with the one or more power switches 2A, 2B of the switching assembly 2 to adsorb heat from these latter.

Preferably, the heat sink element 4 comprises a shaped block (e.g. shaped as a parallelepiped or a cylinder) made of material (e.g. Al or other metal material) having a good thermal conductivity.

Conveniently, said shaped block has a first surface 4A for coupling with the switching assembly 2, a second surface 4B opposite to the first surface 4A and one or more lateral surfaces 4C.

Conveniently, said first and/or second surfaces 4A, 4B may be covered by one or more layers of materials to increase thermal conductivity (e.g. a painting).

Conveniently, said lateral surfaces 4C may be finned to improve the thermal exchange with the surrounding environment.

Figure 13:
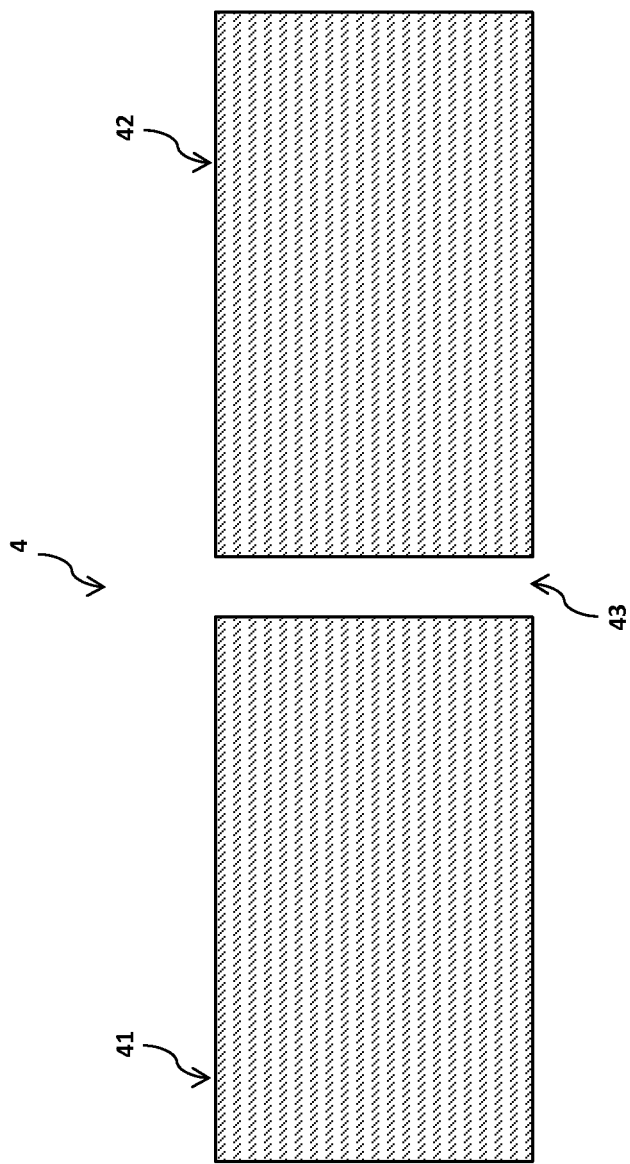
FIGS. 13-14 schematically illustrate further possible variants for a heat sink element included in the solid state switching device, according to the invention.
Figure 14:
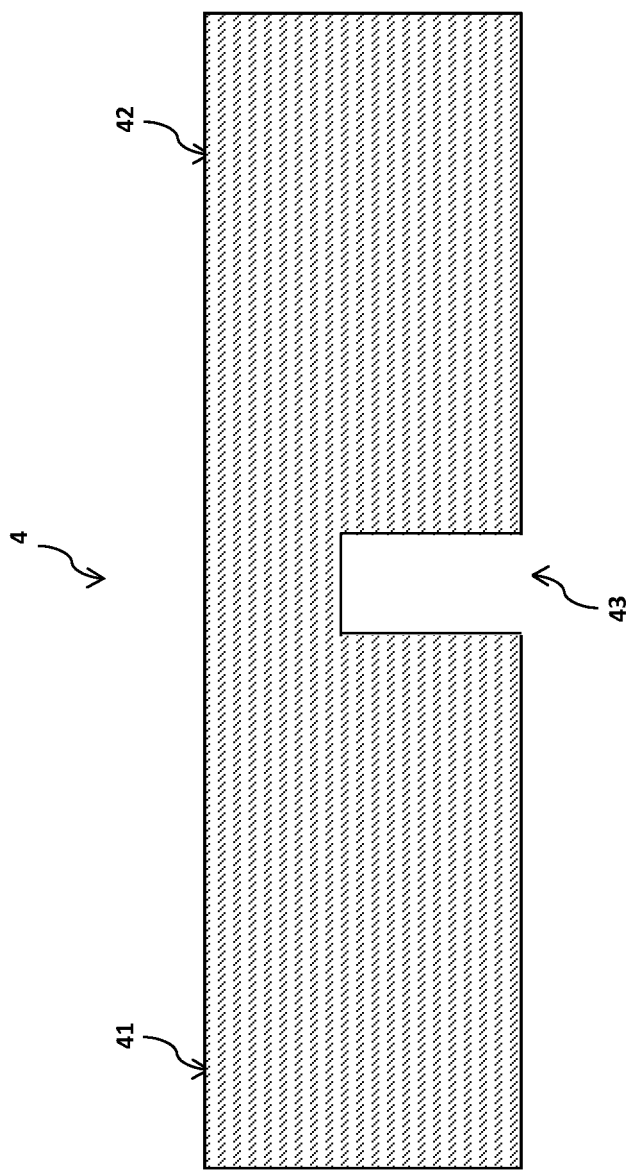

The heat sink element 4 may be formed by a single piece of material as shown in FIGS. 1-12. As an alternative, the heat sink element 4 may include two portions 41, 42 fully or partially separated by an airgap 43 (FIGS. 13, 14).

Conveniently, when the switching assembly 2 comprises two power switches 2A, 2B (FIGS. 7-8), each portion 41, 42 of the heat sink element 4 may be operatively coupled to a corresponding power switch 2A, 2B.

In general, the heat sink element 4 may be of known type and it will not further described hereinafter for the sake of brevity.

According to the invention, the switching device 1 comprises an additional heat extraction arrangement 5 adapted to adsorb an additional heat flow from the switching assembly 2 and convey at least a portion of the adsorbed heat along the phase conductor P through the first and second line terminals T1, T2.

In practice, the additional heat extraction arrangement 5 is adapted to provide an additional heat extraction path conveying an additional heat flow extracted directly or indirectly from the switching assembly 2 along the phase conductor P passing through the line terminals T1, T2.

This solution allows remarkably improving the efficiency of the heat extraction process from the switching assembly 2.

In the embodiments of the invention in which the above-mentioned electric line comprises a neutral conductor N, the additional heat extraction arrangement 5 is adapted to adsorb heat from the heat sink element 4 and to convey at least a portion of the adsorbed heat along the neutral conductor N through the first and second neutral terminals N1, N2.

The above-described solution provides a further additional heat extraction path that conveys a further additional heat flow extracted from the heat sink element 4 (and consequently from the switching devices 2) along the neutral conductor N passing through the neutral terminals N1, N2.

This solution further improves the efficiency of the heat extraction process from the switching assembly 2.

In some embodiments of the invention (FIGS. 1-2, 3-4, 7-8, 9-10), the additional heat extraction arrangement 5 is adapted to thermally couple the line terminals T1, T2 with the switching assembly 2 and electrically couple the first and second line terminals T1, T2 respectively with the first and second power terminals P1, P2 of the switching assembly 2 to ensure electrical continuity between the line terminals T1, T2 and the corresponding power terminals P1, P2.

In practice, according to these embodiments, parts or components of the additional heat extraction arrangement 5 provide also the electrical connection between the line terminals T1, T2 and the power terminals P1, P2.

The above-described solution provides a common path for the line current and the heat extracted from the switching assembly 2, at the interface with heat sink element 4.

According to some variants of these embodiments of the invention (FIGS. 1-2, 7-8), the additional heat extraction arrangement 5 comprises:

a first electro-thermal conductor element 7, which thermally couples the first line terminal T1 with the switching assembly 2 and which electrically couples the first line terminal T1 with the first power terminal P1 of the switching assembly 2;

a second electro-thermal conductor element 8, which thermally couples the second line terminal T2 with the switching assembly 2 and which electrically couples the second line terminal T2 with the second power terminal P2 of the switching assembly 2.

When the switching assembly 2 comprises a single power switch 2A (FIGS. 1-2), the first electro-thermal conductor element 7 thermally couples the first line terminal T1 with the power switch 2A (in addition to providing the electrical coupling with the power terminal P1) and the second electro-thermal conductor element 8 thermally couples the second line terminal T2 with the power switch 2A (in addition to providing the electrical coupling with the power terminal P2).

When the switching assembly 2 comprises two power switches 2A, 2B (FIGS. 7-8), the first electro-thermal conductor element 7 thermally couples the first line terminal T1 with the power switch 2A (in addition to providing the electrical coupling with the power terminal P1) and the second electro-thermal conductor element 8 thermally couples the second line terminal T2 with the power switch 2B (in addition to providing the electrical coupling with the power terminal P2).

Preferably, the first and second electro-thermal conductor elements 7, 8 are positioned in proximity of the heat sink element 4 at the first surface 4A of this latter.

Preferably, when the switching assembly 2 comprises a single power switch 2A (FIGS. 1-2), the power switch 2A is mounted on both the electro-thermal conductor elements 7, 8 to ensure a good thermal coupling with these latter.

Preferably, when the switching assembly 2 comprises two power switches 2A, 2B (FIGS. 7-8), each power switch 2A, 2B is mounted on a respective electro-thermal conductor element 7, 8 to ensure a good thermal coupling with this latter.

Preferably, in this case, each electro-thermal conductor element 7, 8 is formed by a corresponding plate made of material (e.g. Al, Cu) having good thermal and electrical conductivity, which is soldered or pressed onto the package of a corresponding power switch 2A, 2B to ensure an optimal heat exchange with said power switch. The plate of thermal and electric conductive material 7, 8 is electrically wired with the terminal of the power switch 2A-2B, which forms the corresponding power terminal P1, P2 of the switching assembly 2.

Preferably, each line terminal T1, T2 is mounted on a respective electro-thermal conductor element 7, 8 in order to ensure an optimal electrical and thermal coupling with this latter.

Preferably, the additional heat extraction arrangement 5 comprises:
- a first thermal interface element 9, which thermally couples the first electro-thermal conductor element 7 with the heat sink element 4 and which electrically insulates the first electro-thermal conductor element 7 from the heat sink element 4;
- a second thermal interface element 10, which thermally couples the second electro-thermal conductor element 8 with the heat sink element 4 and electrically insulates the second electro-thermal conductor element 8 from the heat sink element 4.

Preferably, the thermal interface elements 9, 10 are positioned between the electro-thermal conductor elements 7, 8 and the heat sink element 4, at the first surface 4A of this latter.

Preferably, each thermal interface element 9, 10 is formed by a corresponding pad of material (e.g. silicon rubber, silicon elastomer, mica, phase change compound, etc.) having good thermal conductivity and good electric insulation properties to avoid leakage currents to flow through the heat sink element 4.

Preferably, when the above-mentioned electric line comprises a neutral conductor N (FIGS. 2, 8), the additional heat extraction arrangement 5 comprises:
- a third thermal interface element 11, which thermally couples the first neutral terminal N1 with the heat sink element 4 and which electrically insulates the first neutral terminal N1 from the heat sink element 4;
- a fourth thermal interface element 12, which thermally couples the second neutral terminal N2 with the heat sink element 4 and which electrically insulates the second neutral terminal N2 from the heat sink element 4.

Preferably, the thermal interface elements 11, 12 are positioned between the neutral terminals N1, N2 and the heat sink element 4, at the second surface 4B of this latter.

Preferably, when the switching assembly 2 comprises two power switches 2A-2B (FIGS. 7-8), the switching device 1 comprises a support board 60 on which the one or more power switches 2A, 2B are mounted.

Conveniently, suitable conductive arrangements 60B (e.g. conduction vias or pins) are realized on the support board 60 to electrically connect the power terminals P1, P2 of the switching assembly 2 with the corresponding electro-thermal conductor elements 7, 8 of the additional heat extraction arrangement 5. Further suitable conduction traces 60A are deposited on the support board 60 to electrically connect the power terminals P3, P4 of the switching assembly 2 one to another. Other conduction traces or arrangements may be possibly realized to electrically connect the terminals of the power switches 2A, 2B with the power terminals P1, P2.

Preferably, the support board 60 is a PCB on which conduction arrangements and traces may be realized by well-known printed circuit manufacturing techniques.

According to further variants of these embodiments of the invention (FIGS. 3-4, 9-10), the additional heat extraction arrangement 5 comprises a third electro-thermal element 17, which thermally and electrically couples the first line terminal T1 with the first power terminal P1 of the switching assembly 2, and a fourth electro-thermal element 18, which thermally and electrically couples the second line terminal T2 with the second power terminal P2 of the switching assembly 2.

Preferably, when the switching assembly 2 comprises a single power switch 2A (FIGS. 3-4), the third electro-thermal conductor element 17 thermally couples the first line terminal T1 with the terminal of the power switch 2A, which forms the first power terminal P1, and the fourth electro-thermal conductor element 18 thermally couples the second line terminal T2 with the terminal of the power switch 2A, which forms the second power terminal P2.

Preferably, when the switching assembly 2 comprises two power switches 2A, 2B (FIGS. 9-10), the third electro-thermal conductor element 17 thermally couples the first line terminal T1 with the terminal of the power switch 2A, which forms the first power terminal P1, and the fourth electro-thermal conductor element 18 thermally couples the second line terminal T2 with the terminal of the power switch 2B, which forms the second power terminal P2.

Preferably, each electro-thermal conductor element 17, 18 is formed by a corresponding conductive wire or bridge made of material (e.g. Al, Cu) with good thermal and electrical conductivity and having an extended section to ensure an optimal heat exchange with the corresponding power switch 2A, 2B.

Preferably, the electric-thermal conductor elements 17, 18 are positioned distally from the heat sink element 4.

Preferably, the one or more power switches 2A, 2B are positioned at the first surface 4A of the heat sink element 4 and they may be thermally coupled to this latter in a known manner. The above-described solution provides a common path for the line current and the heat extracted from the switching assembly 2, distally from the interface with heat sink element 4.

The advantage of the above-described solution consists in allowing a high flexibility in positioning the line terminals T1, T2, which may be quite useful for the purpose of reducing the overall size of the switching device 1.

Preferably, the switching device 1 comprises a support board 6 on which the one or more power switches 2A, 2B are mounted and on which the first and second line terminals T1, T2 are positioned spaced from the heat sink element 4.

Conveniently, when the switching assembly 2 comprises two power switches 2A, 2B (FIGS. 9-10), suitable conduction traces 6A are deposited on the support board 6 to electrically connect the power terminals P3, P4 of the switching assembly 2. Other conduction traces or arrangements may be possibly realized to electrically connect the terminals of the power switches 2A, 2B with the power terminals P1, P2.

Preferably, the support board 6 is a PCB on which conduction arrangements and traces may be realized by well-known printed circuit manufacturing techniques.

According to a further variant (not shown), the line terminals T1, T2 may be positioned in proximity of the heat sink element 4, conveniently at the first surface 4A of this latter instead of being positioned on the support board 6.

Preferably, when the above-mentioned electric line comprises a neutral conductor N (FIGS. 4, 10), the additional heat extraction arrangement 5 comprises:
- a third thermal interface element 11, which thermally couples the first neutral terminal N1 with the heat sink element 4 and which electrically insulates the first neutral terminal N1 from the heat sink element 4;
- a fourth thermal interface element 12, which thermally couples the second neutral terminal N2 with the heat sink element 4 and which electrically insulates the second neutral terminal N2 from the heat sink element 4.

Preferably, the thermal interface elements 11, 12 are positioned between the neutral terminals N1, N2 and the heat sink element 4, at the second surface 4B of this latter.

In other embodiments of the invention (FIGS. 5-6, 11-12), the additional heat extraction arrangement 5 is adapted to thermally couple the first and second line terminals T1, T2 with the heat sink element 4.

In practice, according to these embodiments, the first and second line terminals T1, T2 are positioned in proximity of the heat sink element 4 (at the first surface 4A of this latter) and the additional heat extraction arrangement 5 provides for extracting heat from the switching assembly 2 through the heat sink element 4 and for conveying the extracted heat along the phase conductor P passing through the line terminals T1, T2.

In this case, the additional heat extraction arrangement 5 does not provide an electrical connection between the line terminals T1, T2 and the power terminals P1, P2. These latter components may be electrically connected in a traditional manner by means of conduction wires or conduction traces deposited on an insulating support element.

According to these embodiments, the additional heat extraction arrangement 5 comprises:
- a fifth thermal interface element 13 thermally coupling the first line terminal T1 with the heat sink element 4 and electrically insulating the first line terminal T1 from the heat sink element 4;
- a sixth thermal interface element 14 thermally coupling the second line terminal T2 with the heat sink element 4 and electrically insulating the second line terminal T2 from the heat sink element 4.

Preferably, the thermal interface elements 13, 14 are positioned between the line terminals T1, T2 and the heat sink element 4, at the first surface 4A of this latter.

Preferably, each thermal interface element 13, 14 is formed by a corresponding pad of material (e.g. silicon rubber, silicon elastomer, mica, phase change compound, etc.) having good thermal conductivity and good electric insulation properties to avoid leakage currents to flow through the heat sink element 4.

Preferably, the one or more power switches 2A, 2B are positioned at the first surface 4A of the heat sink element 4 and they may be thermally coupled to this latter in a known manner or, more preferably, through the thermal interface elements 13, 14, which may be suitably arranged so as to be positioned between said one or more power switches 2A, 2B and the heat sink element 4 (FIGS. 5-6, 11-12).

Preferably, the electrical connection between the line terminals T1, T2 and the corresponding power terminals P1, P2 is realized by means of a suitable conductive element 16 (e.g. a wire or a conductive bridge).

Preferably, when the switching assembly 2 comprises two power switches 2A-2B (FIGS. 11-12), the switching device 1 comprises a support board 60 on which the one or more power switches 2A, 2B are mounted.

Conveniently, suitable conduction traces 60A are deposited on the support board 60 to electrically connect the power terminals P3, P4 of the switching assembly 2 one to another. Other conduction traces or arrangements may be possibly realized to electrically connect the terminals of the power switches 2A, 2B with the power terminals P1, P2.

Preferably, the support board 60 is a PCB on which conduction arrangements and traces may be realized by well-known printed circuit manufacturing techniques.

Preferably, when the above-mentioned electric line comprises a neutral conductor N (FIGS. 6, 12), the additional heat extraction arrangement 5 comprises:
- a third thermal interface element 11, which thermally couples the first neutral terminal N1 with the heat sink element 4 and which electrically insulates the first neutral terminal N1 from the heat sink element 4;
- a fourth thermal interface element 12, which thermally couples the second neutral terminal N2 with the heat sink element 4 and which electrically insulates the second neutral terminal N2 from the heat sink element 4.

Preferably, the thermal interface elements 11, 12 are positioned between the neutral terminals 11, 12 and the heat sink element 4, at the second surface 4B of this latter.

A brief description of the specific embodiments shown in FIGS. 1-12 is now provided.

Embodiment #1

Referring to the embodiment of FIG. 1, the switching device 1 comprises a switching assembly 2 including a single power switch 2A. The power switch 2A is mounted on the electro-thermal conductor elements 7, 8, which are formed by conductive plates. The line terminal T1 is mounted on the electro-thermal conductor element 7 whereas the line terminal T2 is mounted on the electro-thermal conductor element 8. The electro-thermal conductors 7, 8 are positioned in proximity of the heat sink element 4 at the first surface 4A of this latter.

The electro-thermal conductors 7, 8 are formed by conductive plates of Cu. Thermal interface elements 9, 10 are interposed between the electro-thermal conductor elements 7, 8 and the heat sink element 4. The thermal interface elements 9, 10 are formed by pads of thermally conductive and electrically insulating material. The electro-thermal conductor elements 7, 8 are electrically connected with the power terminals P1, P2 of the switching assembly 2. According to this embodiment, the additional heat extraction arrangement 5 is formed by the electro-thermal conductor elements 7, 8 and by the thermal interface elements 9, 10.

Embodiment #2

Figure 2:
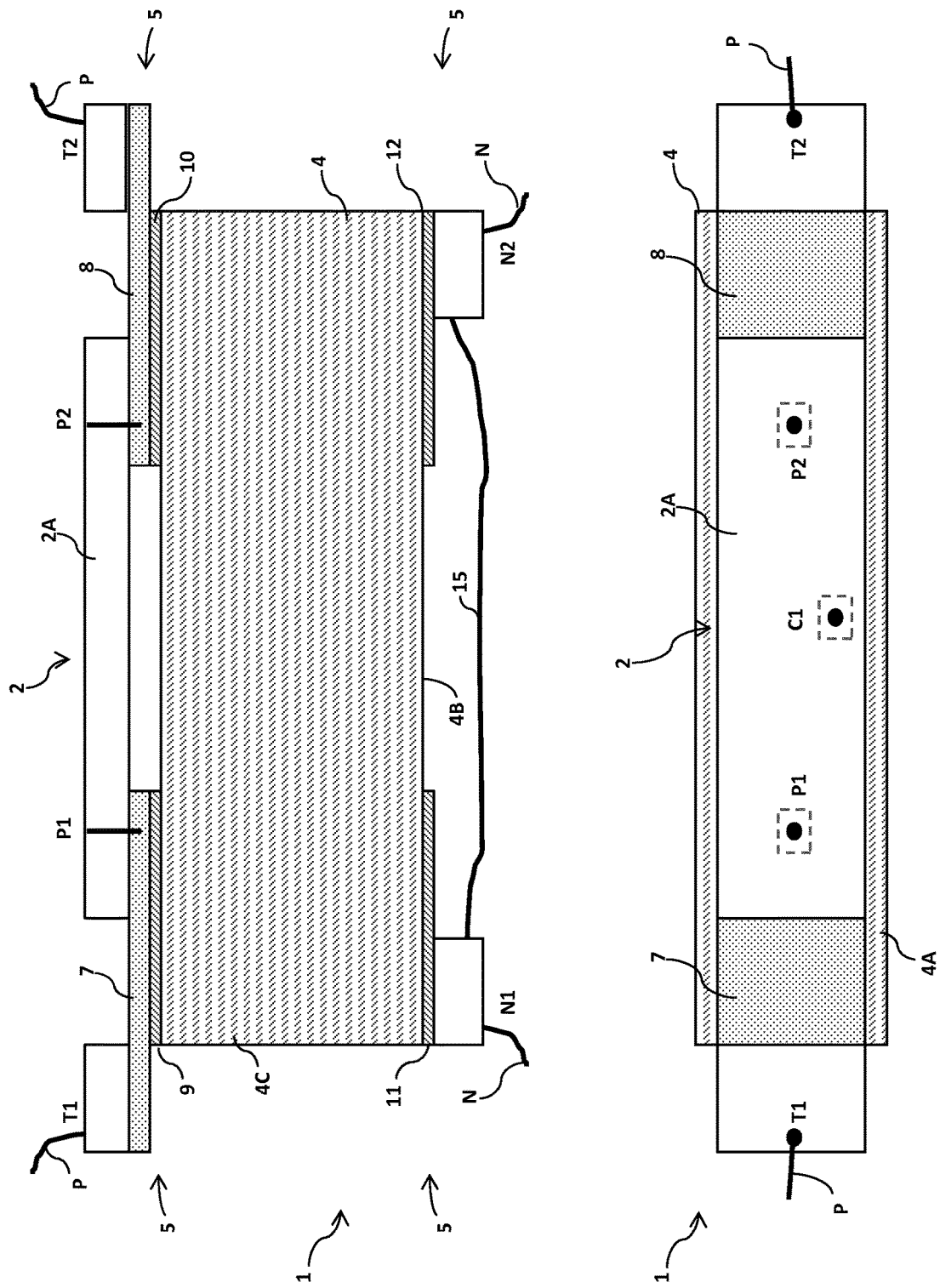

Referring to the embodiment of FIG. 2, the switching device 1 differs from the one described in FIG. 1 in that it comprises the neutral terminal N1, N2 for electrical connection with a neutral conductor N. The neutral terminals N1, N2 are positioned in proximity of the heat sink element 4 at the second surface 4B of this latter. Thermal interface elements 11, 12 are interposed between the neutral terminals N1, N2 and the heat sink element 4. The thermal interface elements 11, 12 are formed by pads of thermally conductive and electrically insulating material. According to this embodiment, the additional heat extraction arrangement 5 is formed by the electro-thermal conductor elements 7, 8 and by the thermal interface elements 9, 10, 11, 12.

Embodiment #3

Figure 3:
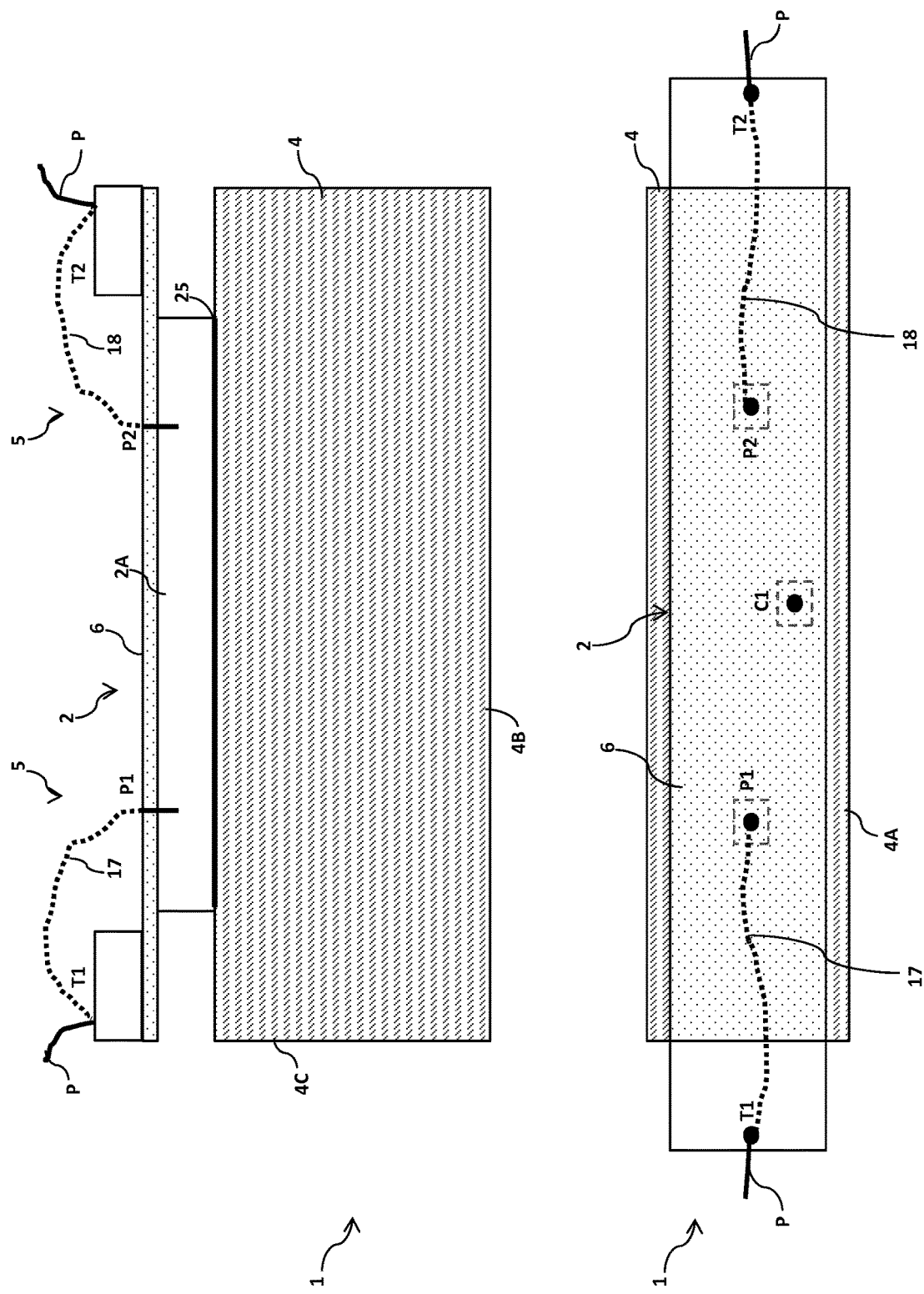
FIGS. 3-4 schematically illustrate a further embodiment of the solid state switching device, according to the invention.

Referring to the embodiment of FIG. 3, the switching device 1 comprises a switching assembly 2 including a single power switch 2A. The power switch 2A is mounted on the heat sink element 4 at the first surface 4A of this latter. At least a layer 25 of thermally conductive material (e.g. a thermal grease) may be interposed between the power switch 2A and the first surface 4A of the heat sink element 4. The power switch 2A is coupled to a first surface of a PCB 6. The first and second line terminals T1, T2 are mounted on the PCB 6 at a second surface opposite to said first surface. Electro-thermal conductor elements 17, 18, which are formed by conductive wires having extended sections (e.g. 5 mm$^2$), electrically and thermally couple the power terminals P1, P2 with the line terminals T1, T2. According to this embodiment, the additional heat extraction arrangement 5 is formed by the electro-thermal conductor elements 17, 18.

Embodiment #4

Figure 4:
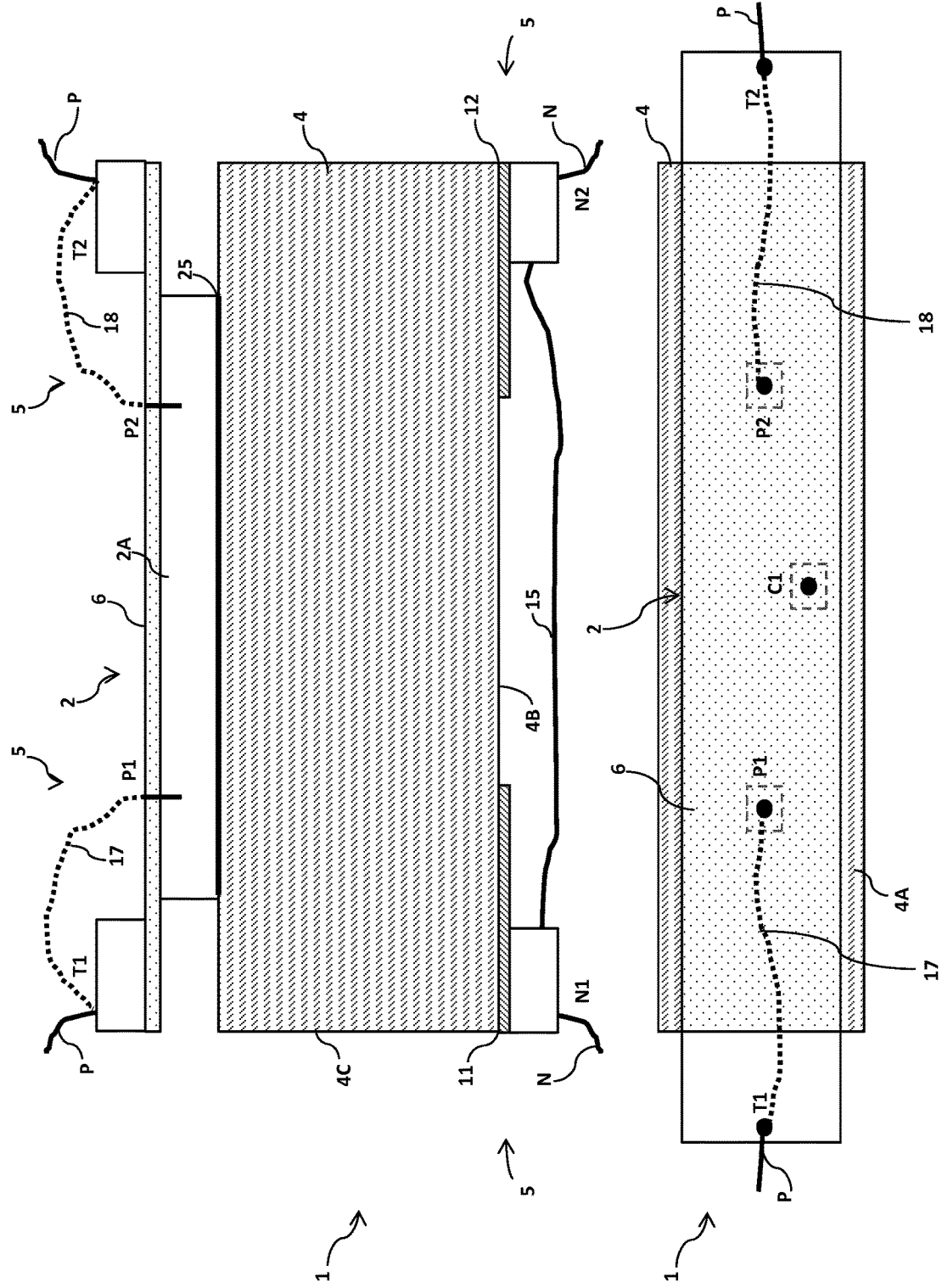

Referring to the embodiment of FIG. 4, the switching device 1 differs from the one described in FIG. 3 in that it comprises the neutral terminal N1, N2 for electrical connection with a neutral conductor N. The neutral terminals N1, N2 are positioned in proximity of the heat sink element 4 at the second surface 4B of this latter. Thermal interface elements 11, 12 are interposed between the neutral terminals N1, N2 and the heat sink element 4. The thermal interface elements 11, 12 are formed by pads of thermally conductive and electrically insulating material. According to this embodiment, the additional heat extraction arrangement 5 is formed by the electro-thermal conductor elements 17, 18 and by the thermal interface elements 11, 12.

Embodiment #5

Figure 5:
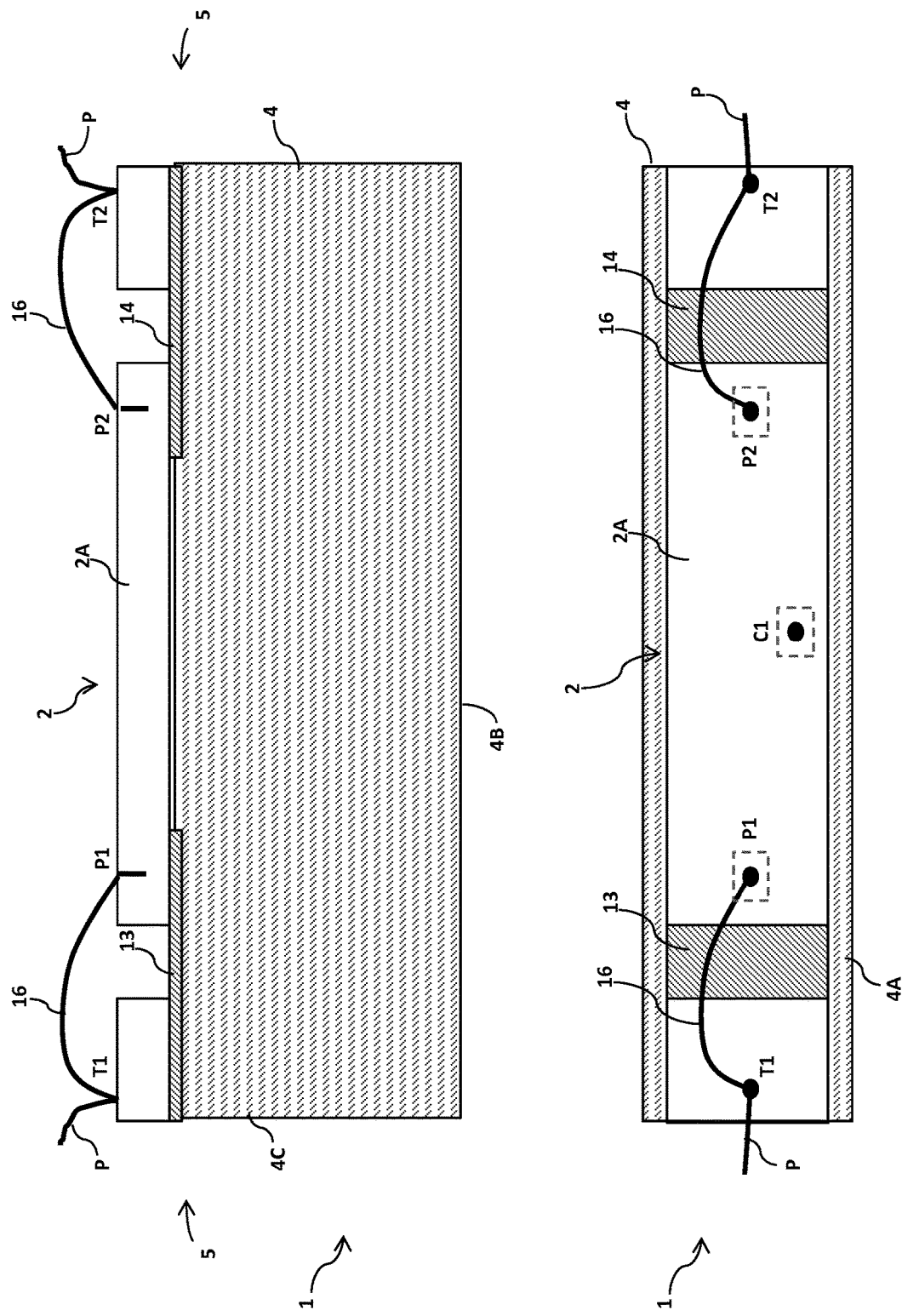
FIGS. 5-6 schematically illustrate a further embodiment of the solid state switching device, according to the invention.

Referring to the embodiment of FIG. 5, the switching device 1 comprises a switching assembly 2 including a single power switch 2A. The power switch 2A and the line terminals T1, T2 are positioned in proximity of the heat sink element 4 at the first surface 4A of this latter. Thermal interface elements 13, 14 are interposed between the line terminals T1, T2 and the heat sink element 4. The thermal interface elements 13, 14 are also interposed between the power switch 2A and the heat sink element 4. The thermal interface elements 13, 14 are formed by pads of thermally conductive and electrically insulating material. Traditional conductive wires 16 electrically couple the power terminals P1, P2 with the line terminals T1, T2. According to this embodiment, the additional heat extraction arrangement 5 is formed by the thermal interface elements 13, 14.

Embodiment #6

Figure 6:
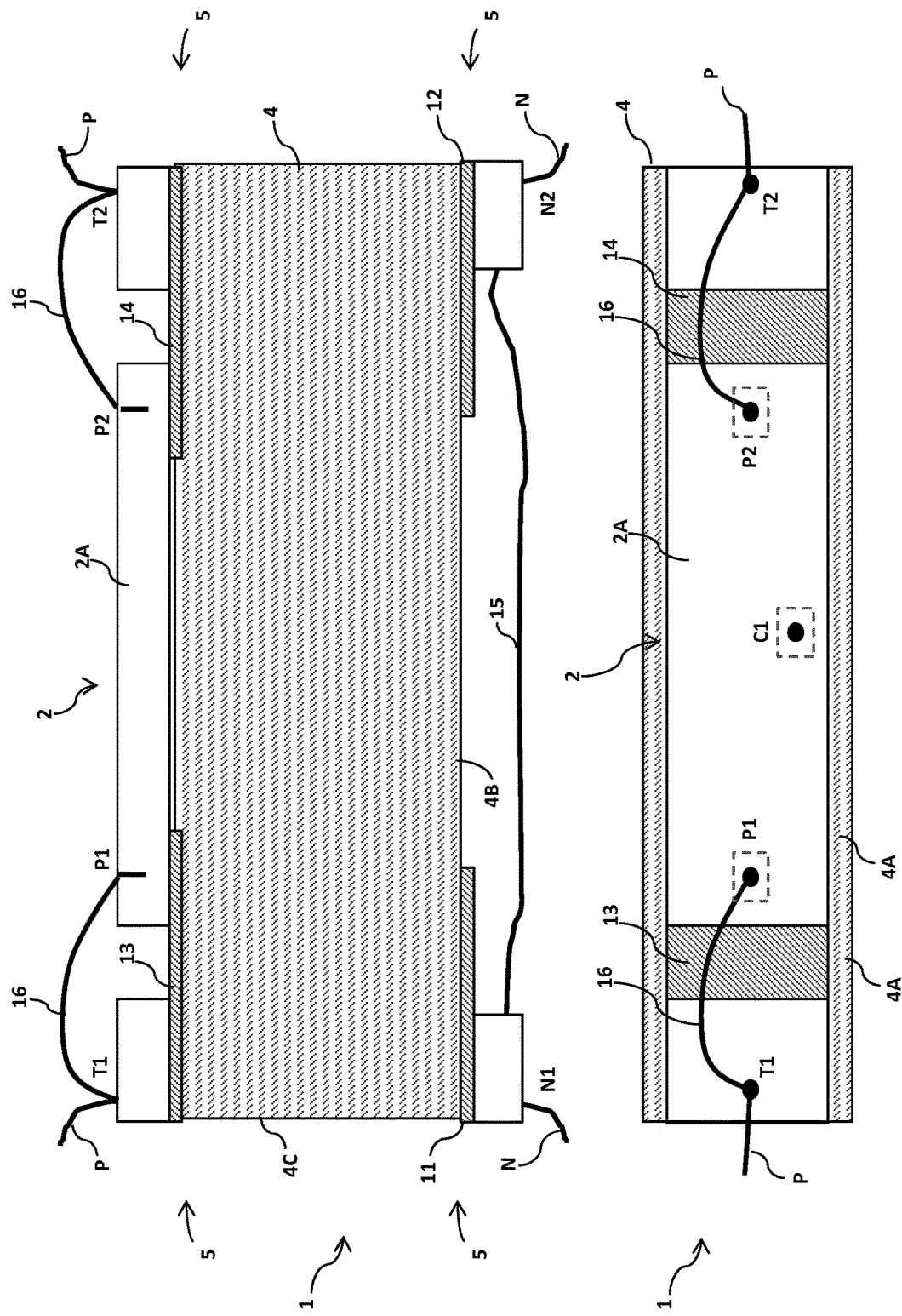

Referring to the embodiment of FIG. 6, the switching device 1 differs from the one described in FIG. 5 in that it comprises the neutral terminal N1, N2 for electrical connection with a neutral conductor N. The neutral terminals N1, N2 are positioned in proximity of the heat sink element 4 at the second surface 4B of this latter. Thermal interface elements 11, 12 are interposed between the neutral terminals N1, N2 and the heat sink element 4. The thermal interface elements 11, 12 are formed by pads of thermally conductive and electrically insulating material. According to this embodiment, the additional heat extraction arrangement 5 is formed by the thermal interface elements 11, 12, 13, 14.

Embodiment #7

Figure 7:
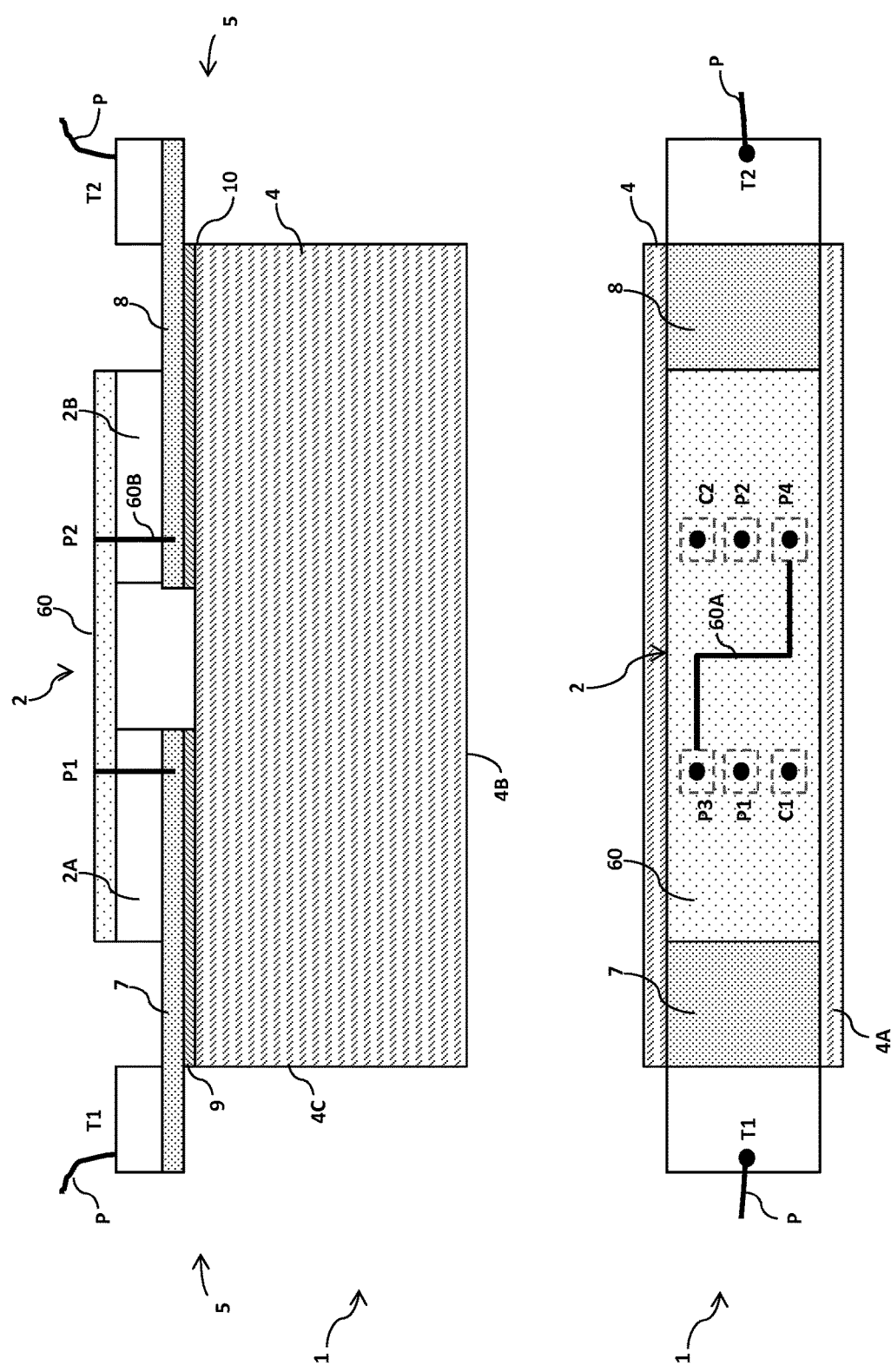
FIGS. 7-8 schematically illustrate a further embodiment of the solid state switching device, according to the invention.

Referring to the embodiment of FIG. 7, the switching device 1 comprises a switching assembly 2 including two power switches 2A, 2B. The power switch 2A is mounted on the electro-thermal conductor element 7 whereas the power switch 2B is mounted on the electro-thermal conductor element 8. The electro-thermal conductors 7, 8 are formed by conductive plates of Cu. The line terminal T1 is mounted on the electro-thermal conductor element 7 whereas the line terminal T2 is mounted on the electro-thermal conductor element 8. The electro-thermal conductors 7, 8 are positioned in proximity of the heat sink element 4 at the first surface 4A of this latter. The electro-thermal conductors 7, 8 are formed by conductive plates of Cu. Thermal interface elements 9, 10 are interposed between the electro-thermal conductor elements 7, 8 and the heat sink element 4. The thermal interface elements 9, 10 are formed by pads of thermally conductive and electrically insulating material. The electro-thermal conductor elements 7, 8 are electrically connected with the power terminals P1, P2 of the switching assembly 2. The power switches 2A, 2B are coupled to a PCB 60. Suitable conductive traces 60A are deposited on the PCB 60 to electrically connect the power terminals P3, P4 of the switching assembly 2 one to another.

According to this embodiment, the additional heat extraction arrangement 5 is formed by the electro-thermal conductor elements 7, 8 and by the thermal interface elements 9, 10.

Embodiment #8

Figure 8:
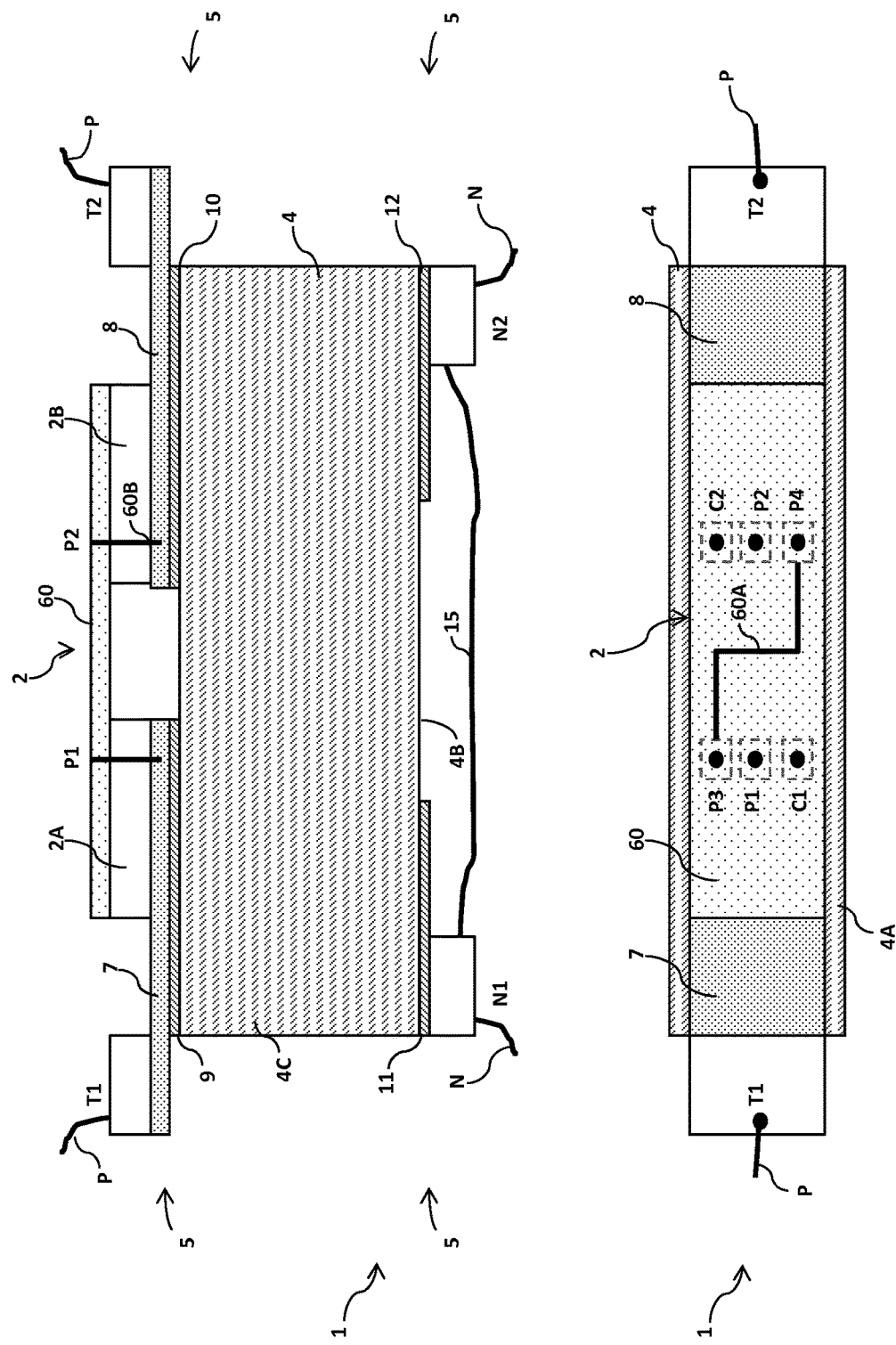

Referring to the embodiment of FIG. 8, the switching device 1 differs from the one described in FIG. 7 in that it comprises the neutral terminal N1, N2 for electrical connection with a neutral conductor N. The neutral terminals N1, N2 are positioned in proximity of the heat sink element 4 at the second surface 4B of this latter. Thermal interface elements 11, 12 are interposed between the neutral terminals N1, N2 and the heat sink element 4. The thermal interface elements 11, 12 are formed by pads of thermally conductive and electrically insulating material. According to this embodiment, the additional heat extraction arrangement 5 is formed by the electro-thermal conductor elements 7, 8 and by the thermal interface elements 9, 10, 11, 12.

Embodiment #9

Referring to the embodiment of FIG. 9, the switching device 1 comprises a switching assembly 2 including two power switches 2A, 2B. The power switches 2A, 2B are mounted on the heat sink element 4 at the first surface 4A of this latter. The power switches 2A, 2B are coupled to a first surface of a PCB 6. At least a layer 25 of thermally conductive material (e.g. a thermal grease) may be interposed between each power switch 2A, 2B and the first surface 4A of the heat sink element 4. The first and second line terminals T1, T2 are mounted on the PCB 6 at a second surface opposite to said first surface. Electro-thermal conductor elements 17, 18, which are formed by conductive wires having extended sections (e.g. 5 mm$^2$), electrically and thermally couple the power terminals P1, P2 with the line terminals T1, T2. Suitable conductive traces 6A are deposited on the PCB 6 to electrically connect the power terminals P3, P4 of the switching assembly 2 one to another. According to this embodiment, the additional heat extraction arrangement 5 is formed by the electro-thermal conductor elements 17, 18.

Embodiment #10

Figure 10:
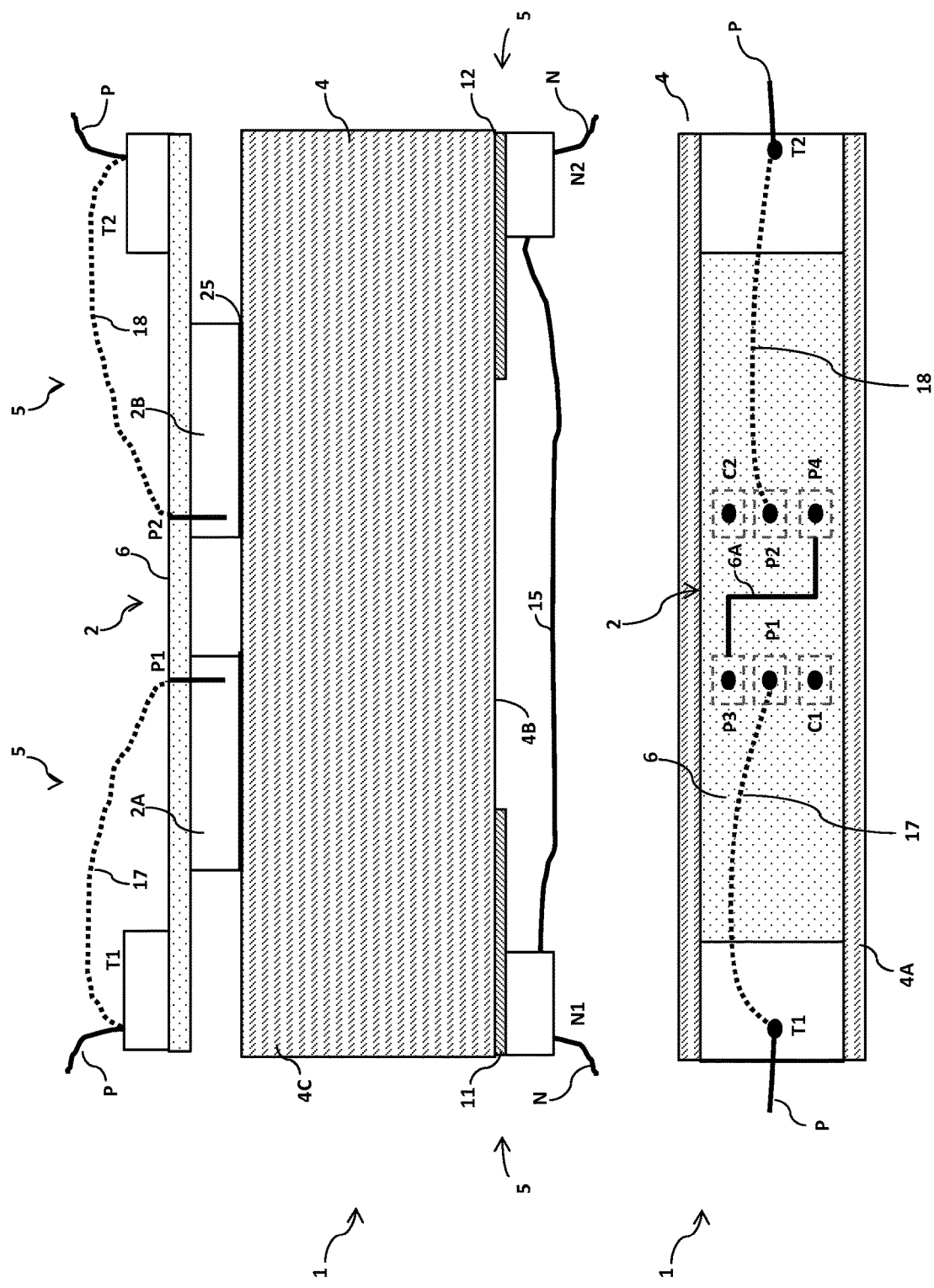

Referring to the embodiment of FIG. 10, the switching device 1 differs from the one described in FIG. 9 in that it comprises the neutral terminal N1, N2 for electrical connection with a neutral conductor N. The neutral terminals N1, N2 are positioned in proximity of the heat sink element 4 at the second surface 4B of this latter. Thermal interface elements 11, 12 are interposed between the neutral terminals N1, N2 and the heat sink element 4. The thermal interface elements 11, 12 are formed by pads of thermally conductive and electrically insulating material. According to this embodiment, the additional heat extraction arrangement 5 is formed by the electro-thermal conductor elements 17, 18 and by the thermal interface elements 11, 12.

Embodiment #11

Figure 11:
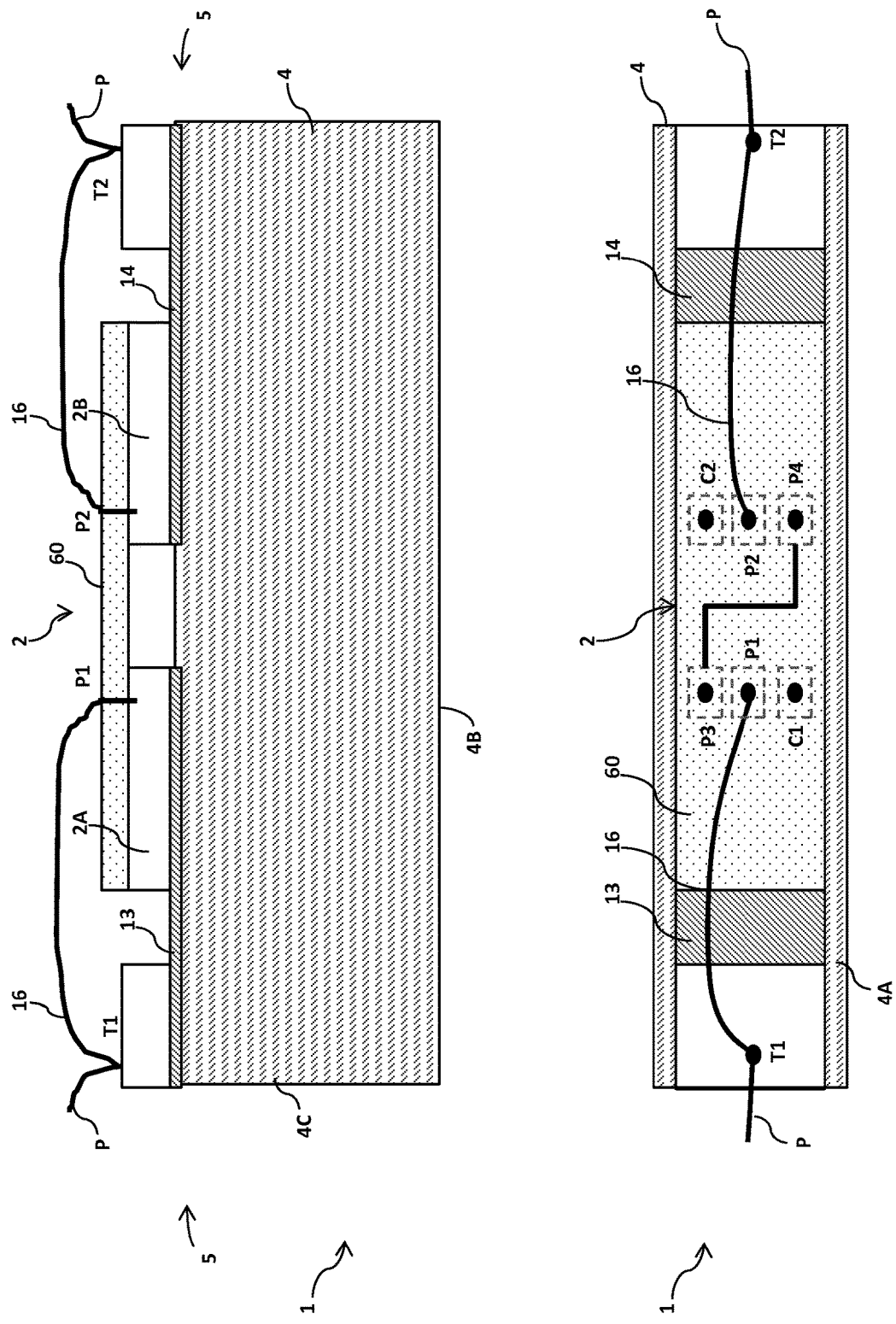
FIGS. 11-12 schematically illustrate a further embodiment of the solid state switching device, according to the invention.

Referring to the embodiment of FIG. 11, the switching device 1 comprises a switching assembly 2 including two power switches 2A, 2B. The power switches 2A, 2B and the line terminals T1, T2 are positioned in proximity of the heat sink element 4 at the first surface 4A of this latter. Thermal interface elements 13, 14 are interposed between the line terminals T1, T2 and the heat sink element 4. The thermal interface elements 13, 14 are also interposed between the power switches 2A, 2B and the heat sink element 4. The thermal interface elements 9, 10 are formed by pads of thermally conductive and electrically insulating material. Traditional conductive wires 16 electrically couple the power terminals P1, P2 with the line terminals T1, T2. The power switches 2A, 2B are coupled to a PCB 60. Suitable conductive traces 60A are deposited on the PCB 60 to electrically connect the power terminals P3, P4 of the switching assembly 2 one to another. According to this embodiment, the additional heat extraction arrangement 5 is formed by the thermal interface elements 13, 14.

Embodiment #12

Figure 12:
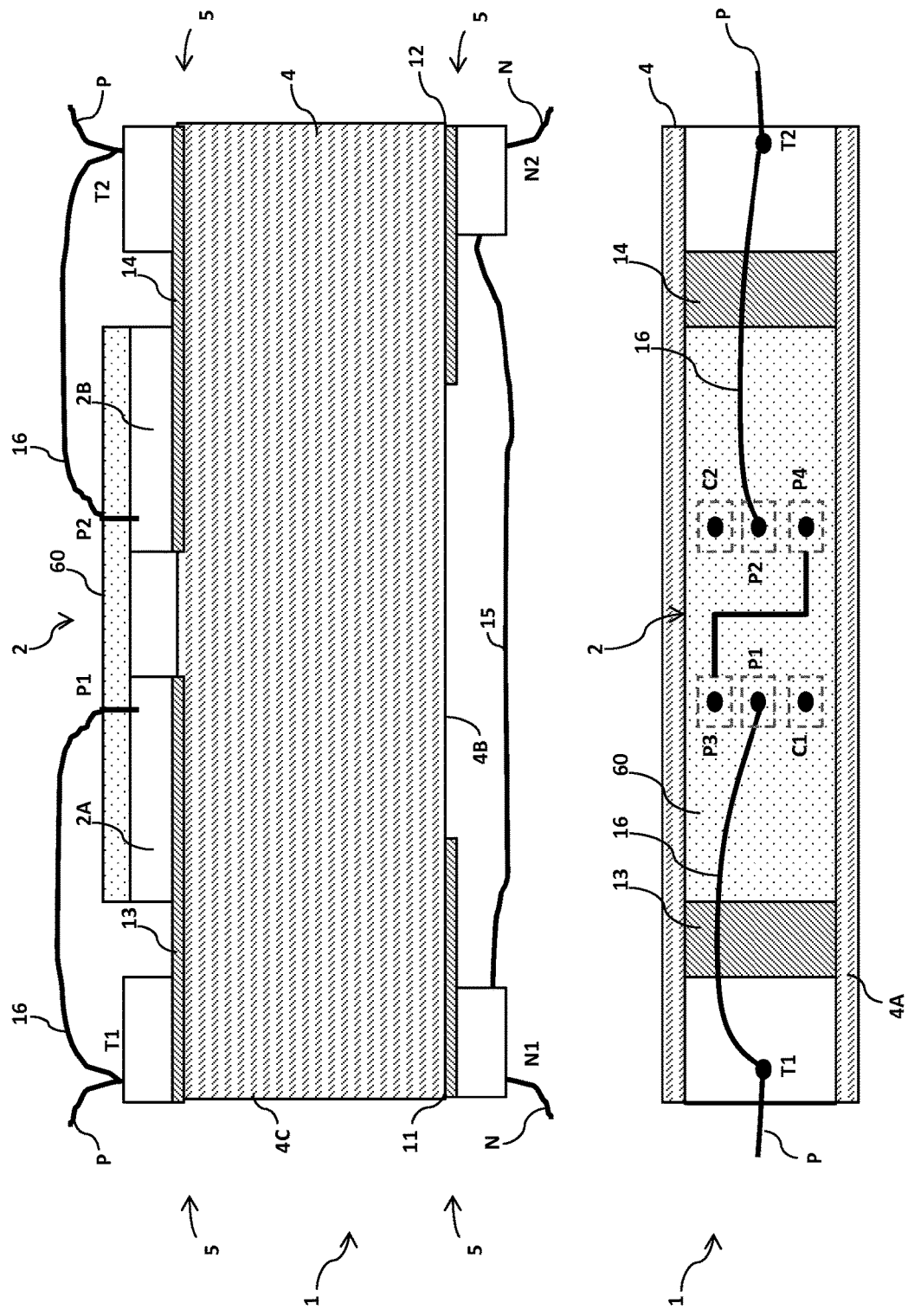

Referring to the embodiment of FIG. 12, the switching device 1 differs from the one described in FIG. 11 in that it comprises the neutral terminal N1, N2 for electrical connection with a neutral conductor N. The neutral terminals N1, N2 are positioned in proximity of the heat sink element 4 at the second surface 4B of this latter. Thermal interface elements 11, 12 are interposed between the neutral terminals N1, N2 and the heat sink element 4. The thermal interface elements 11, 12 are formed by pads of thermally conductive and electrically insulating material. According to this embodiment, the additional heat extraction arrangement 5 is formed by the thermal interface elements 11, 12, 13, 14.

The switching device 1 of the invention has been above described with particular reference to the case in which the above-mentioned electric line comprises a single phase conductor P for the sake of simplicity. However, from the description and the example above-illustrated, it is evident that, when the above-mentioned electric line comprises multiple phase conductors, the switching device 1 comprises a corresponding number of pairs of line terminals T1, T2, a corresponding number of switching assemblies 2 and a corresponding number of additional heat extraction arrangements 5.

Preferably, for these applications, the switching device 1 comprises a single heat sink element 4.

It has been seen in practice how the solid state switching device 1, according to the present invention, allows the above-mentioned aims and objects to be achieved.

The additional heat extraction arrangement 5 allows remarkably improving the efficiency of the heat extraction process from the switching assembly 2.

In the following, a table reporting experimental steady-state temperature measurements carried out on a traditional solid state switching device and on a switching device, according to the invention (Embodiment #7), is presented.

The tested switching devices have similar construction with the exception of the presence of the additional heat extraction arrangement of the invention.

Both the tested switching devices include two power switches and have been operated at a same line current (12A) for a same time interval sufficiently long to reach a steady-state condition (e.g. 15 min).

|  | Traditional solid state switching device | Embodiment #7 of the invention |
| --- | --- | --- |
| Heat Sink Temperature (° C.) | 52.8 | 45.2 |
| Ambient Temperature (° C.) | 22.4 | 21.2 |
| Line Terminal Temperature (° C.) | 30.5 | 39.8 |

As it is possible to appreciate, the switching device of the invention shows a lower operating temperature of the heat sink element and a higher operating temperature of the line terminals occurred with respect to the traditional switching device. Such a phenomenon is due to the presence of the additional heat extraction arrangement, which adsorbs an additional heat flow from the heat sink element (and consequently from power switches) and conveys the adsorbed heat along the phase conductor through the line terminals.

The improved heat extraction efficiency provided by the additional heat extraction arrangement of the invention provides relevant advantages, particularly in terms of designing flexibility.

On one hand, it is possible to reduce the size of the heat sink element and therefore the overall size of a switching device operating at given nominal line current level.

On the other hand, it is possible to make a switching device to operate at a higher nominal line current level while maintaining constant the size of the heat sink element and therefore the overall size of said switching device.

The switching device of the invention can thus have a relatively small size with respect to traditional devices having a same current rate or show improved performances with respect to traditional devices having a same overall size.

The switching device of the invention has a relatively simple and compact structure that can be easily assembled with well-established electronic circuit manufacturing processes, e.g. employing well-known printed circuit manufacturing techniques.

The switching device of the invention is therefore easy and inexpensive to produce at industrial level, with manufacturing techniques of known type.

The invention claimed is:

1. A solid state switching device comprising:
a pair of line terminals including first and second line terminals for electrical connection with a corresponding phase conductor of an electric line;
a switching assembly including one or more solid state power switches, said switching assembly having first and second power terminals electrically connected with said first and second line terminals, respectively;
a heat sink element in thermal coupling with said switching assembly to draw heat from said switching assembly; and
an additional heat extraction arrangement in contact with said switching assembly and with said pair of line terminals, said additional heat extraction arrangement configured to extract heat from said switching assembly and convey at least a portion of the extracted heat from said switching assembly through said first and second line terminals to the corresponding phase conductors of the electric line.

2. The solid state switching device, according to claim 1, wherein it comprises first and second neutral terminals for electrical connection with a neutral conductor of said electric line, wherein said additional heat extraction arrangement draws heat from said heat sink element and conveys at least a portion of the drawn heat along said neutral conductor through said first and second neutral terminals.

3. The solid state switching device, according to claim 1, wherein said additional heat extraction arrangement thermally couples said first and second line terminals with said switching assembly and electrically couples said first and second line terminals respectively with the first and second power terminals of said switching assembly.

4. The solid state switching device, according to claim 3, wherein said additional heat extraction arrangement comprises:
a first electro-thermal conductor element thermally coupling said first line terminal with said switching assembly and electrically coupling said first line terminal with said first power terminal;
a second electro-thermal conductor element thermally coupling said second line terminal with said switching assembly and electrically coupling said second line terminal with said second power terminal.

5. The solid state switching device, according to claim 4, wherein said switching assembly comprises a single solid state power switch.

6. The solid state switching device, according to claim 4, wherein said switching assembly comprises a first solid state power switch and a second solid state power switch electrically connected one to another.

7. The solid state switching device according to claim 4, wherein said additional heat extraction arrangement comprises:
a first thermal interface element thermally coupling said first electro-thermal conductor element with said heat sink element and electrically insulating said first electro-thermal conductor element from said heat sink element;
a second thermal interface element thermally coupling said second electro-thermal conductor element with said heat sink element and electrically insulating said second electro-thermal conductor element from said heat sink element.

8. The solid state switching device, according to claim 7, wherein it comprises first and second neutral terminals for electrical connection with a neutral conductor of said electric line, wherein said additional heat extraction arrangement draws heat from said heat sink element and conveys at least a portion of the drawn heat along said neutral conductor through said first and second neutral terminals, and wherein said additional heat extraction arrangement comprises:
a third thermal interface element thermally coupling said first neutral terminal with said heat sink element and electrically insulating said first neutral terminal from said heat sink element;
a fourth thermal interface element thermally coupling said second neutral terminal with said heat sink element and electrically insulating said second neutral terminal from said heat sink element.

9. The solid state switching device, according to claim 3, wherein said additional heat extraction arrangement comprises a third electro-thermal element thermally and electrically coupling said first line terminal with said first power terminal and a fourth electro-thermal element thermally and electrically coupling said second line terminal with said second power terminal.

10. The solid state switching device, according to claim 9, wherein said third and fourth electro-thermal conductor elements are formed by corresponding conductive wires or bridges made of material with good thermal and electrical conductivity and having extended sections.

11. The solid state switching device, according to claim 9, wherein said switching assembly comprises a single solid state power switch.

12. The solid state switching device, according to claim 9, wherein said switching assembly comprises a first solid state power switch and a second solid state power switch electrically connected one to another.

13. The solid state switching device according to claim 9, wherein it comprises first and second neutral terminals for electrical connection with a neutral conductor of said electric line, wherein said additional heat extraction arrangement draws heat from said heat sink element and conveys at least a portion of the drawn heat along said neutral conductor through said first and second neutral terminals, and wherein said additional heat extraction arrangement comprises:
a third thermal interface element thermally coupling said first neutral terminal with said heat sink element and electrically insulating said first neutral terminal from said heat sink element;
a fourth thermal interface element thermally coupling said second neutral terminal with said heat sink element and electrically insulating said second neutral terminal from said heat sink element.

14. The solid state switching device, according to claim 1, wherein said additional heat extraction arrangement thermally couples said first and second line terminals with said heat sink element.

15. The solid state switching device, according to claim 14, wherein said additional heat extraction arrangement comprises:
a fifth thermal interface element thermally coupling said first line terminal with said heat sink element and electrically insulating said first line terminal from said heat sink element;
a sixth thermal interface element thermally coupling said second line terminal with said heat sink element and electrically insulating said second line terminal from said heat sink element.

16. The solid state switching device, according to claim 15, wherein said switching assembly comprises a single solid state power switch.

17. The solid state switching device, according to claim 15, wherein said switching assembly comprises a first solid state power switch and a second solid state power switch electrically connected one to another.

18. The solid state switching device, according to claim 15, wherein it comprises first and second neutral terminals for electrical connection with a neutral conductor of said electric line, wherein said additional heat extraction arrangement draws heat from said heat sink element and conveys at least a portion of the drawn heat along said neutral conductor through said first and second neutral terminals, and wherein said additional heat extraction arrangement comprises:
- a third thermal interface element thermally coupling said first neutral terminal with said heat sink element and electrically insulating said first neutral terminal from said heat sink element;
- a fourth thermal interface element thermally coupling said second neutral terminal with said heat sink element and electrically insulating said second neutral terminal from said heat sink element.

* * * * *